(12) United States Patent
Okada et al.

(10) Patent No.: US 11,935,819 B2
(45) Date of Patent: Mar. 19, 2024

(54) CIRCUIT MODULE HAVING A PLURALITY OF LEAD FRAMES CONNECTED TO A SUBSTRATE BY METAL POSTS

(71) Applicant: Murata Manufacturing Co., Ltd., Nagaokakyo (JP)

(72) Inventors: Hideshi Okada, Nagaokakyo (JP); Shoya Yamamoto, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 214 days.

(21) Appl. No.: 17/692,240

(22) Filed: Mar. 11, 2022

(65) Prior Publication Data
US 2022/0293497 A1 Sep. 15, 2022

(30) Foreign Application Priority Data

Mar. 15, 2021 (JP) ................................ 2021-040904

(51) Int. Cl.
*H01L 23/495* (2006.01)
*H01L 21/56* (2006.01)
(Continued)

(52) U.S. Cl.
CPC ........ *H01L 23/49537* (2013.01); *H01L 21/56* (2013.01); *H01L 23/3107* (2013.01); *H01L 23/3121* (2013.01); *H01L 23/49517* (2013.01); *H01L 23/4952* (2013.01); *H01L 23/49541* (2013.01); *H01L 23/49548* (2013.01); *H01L 23/49568* (2013.01); *H01L 23/49575* (2013.01); *H01L 23/49586* (2013.01); *H01L 23/498* (2013.01); *H01L 25/0652* (2013.01); *H01L 25/072* (2013.01); *H01L 25/165* (2013.01); *H01L 2924/181* (2013.01)

(58) Field of Classification Search
CPC ......... H01L 23/49537; H01L 23/49568; H01L 23/3107; H01L 23/4952; H01L 23/49541; H01L 23/49548; H01L 23/49586; H01L 23/49575; H01L 23/3121; H01L 23/49517; H01L 23/498; H01L 21/56; H01L 25/0652; H01L 25/072; H01L 2924/181
See application file for complete search history.

(56) References Cited

U.S. PATENT DOCUMENTS 11,309,259 B2 * 4/2022 Nomura .................. H01L 23/66
2005/0248041 A1 * 11/2005 Kuah ................ H01L 23/49541
257/787

(Continued)

FOREIGN PATENT DOCUMENTS

JP  2005-102485 A  4/2005
JP  2007281182 A  10/2007

(Continued)

OTHER PUBLICATIONS

Office Action in JP2021040904, dated Aug. 1, 2023, 4 pages.

*Primary Examiner* — Alonzo Chambliss
(74) *Attorney, Agent, or Firm* — Keating & Bennett, LLP

(57) ABSTRACT

In a circuit module, lead frames include top surfaces facing a main surface of a substrate and bottom surfaces exposed from an insulating seal. The lead frames include pad portions including portions of the top surfaces and connected to metal posts, and lead portions including the bottom surfaces. The pad portions completely overlap the metal posts.

20 Claims, 8 Drawing Sheets

(51) Int. Cl.
*H01L 23/31* (2006.01)
*H01L 23/498* (2006.01)
*H01L 25/065* (2023.01)
*H01L 25/07* (2006.01)
*H01L 25/16* (2023.01)

(56) References Cited

U.S. PATENT DOCUMENTS

| | | | |
|---|---|---|---|
| 2011/0248392 A1* | 10/2011 | Javier | ............... H01L 21/4828 |
| | | | 257/676 |
| 2014/0063764 A1 | 3/2014 | Tanaka et al. | |
| 2015/0179621 A1* | 6/2015 | Matsumoto | ............ H01L 24/17 |
| | | | 257/737 |
| 2017/0271233 A1 | 9/2017 | Imai | |

FOREIGN PATENT DOCUMENTS

| | | | |
|---|---|---|---|
| JP | 2009-049173 A | 3/2009 |
| JP | 2015-095597 A | 5/2015 |
| JP | 5951414 B2 | 7/2016 |
| JP | 2017174849 A | 9/2017 |

\* cited by examiner

CIRCUIT MODULE HAVING A PLURALITY OF LEAD FRAMES CONNECTED TO A SUBSTRATE BY METAL POSTS

CROSS REFERENCE TO RELATED APPLICATIONS

This application claims the benefit of priority to Japanese Patent Application No. 2021-040904 filed on Mar. 15, 2021. The entire contents of this application are hereby incorporated herein by reference.

BACKGROUND OF THE INVENTION

1. Field of the Invention

The present invention relates to a circuit module that includes a circuit substrate on which an electronic component is mounted and a plurality of terminals that connect the circuit substrate to an external substrate or the like.

2. Description of the Related Art

Japanese Patent No. 05951414 discloses a built-in-electronic-component substrate. A built-in-electronic-component circuit substrate disclosed in Japanese Patent No. 05951414 includes two substrates and a plurality of electronic components mounted between the two substrates.

The built-in-electronic-component circuit substrate disclosed in Japanese Patent No. 05951414 is provided with a plurality of connection pads, which are for connection to an external circuit, on an outer surface of the built-in-electronic-component circuit substrate. The substrate and the connection pads are connected to each other by metal posts.

In the built-in-electronic-component substrate disclosed in Japanese Patent No. 05951414, when wiring lines and electronic components are disposed between two adjacent metal posts (or between two adjacent connection pads) the distance between the metal posts needs to be greater than or equal to a prescribed threshold.

Therefore, the number of metal posts per unit area is reduced compared to a case where no wiring lines or electronic components are disposed, and consequently heat dissipation performance is reduced. Furthermore, if the distance between the metal posts is reduced, the heat dissipation performance is improved, but the space in which to dispose electronic components or wiring lines is reduced.

Thus, there is a trade-off relationship between the space between metal posts and heat dissipation performance and there is a problem in that it is difficult to achieve heat dissipation performance and also secure space between the metal posts.

SUMMARY OF THE INVENTION

Preferred embodiments of the present invention provide circuit modules that each achieve heat dissipation performance and also secure space between metal posts.

A circuit module according to an aspect of a preferred embodiment of the present invention includes a substrate, a plurality of lead frames, a plurality of metal posts, and an insulating seal. The substrate includes a plurality of electronic components defining an electronic circuit mounted thereon and includes a first main surface. The plurality of lead frames are separated from the substrate at a side where the first main surface side of the substrate is located. The plurality of metal posts are columns between the plurality of lead frames and the first main surface and connecting the plurality of lead frames and electrodes on the first main surface to each other. The insulating seal seals the plurality of metal posts, the first main surface, and portions of the plurality of lead frames.

The plurality of lead frames include first LF surfaces that face the first main surface and second LF surfaces that are on an opposite side from the first LF surfaces and are exposed from the insulating sealing resin. The plurality of lead frames include pad portions that include portions of the first LF surfaces and are connected to the metal posts. The pad portions overlap the metal posts when looking through the insulating seal in a direction perpendicular to the first main surface.

With this configuration, the number of metal posts per unit area can be increased by using columnar metal posts. In addition, since the lead frames do not contact the substrate, the space available for mounting electronic components on the substrate is increased. Furthermore, the lead frames include pad portions that overlap the metal posts, and therefore the amount of heat conducted to the outside from the metal posts via the lead frames is increased.

According to the aspects of preferred embodiments of the present invention, heat dissipation performance can be achieved and space between metal posts can also be secured.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

First Preferred Embodiment

A circuit module according to a First Preferred Embodiment of the present invention will be described with reference to the drawings.

Figure 1A:
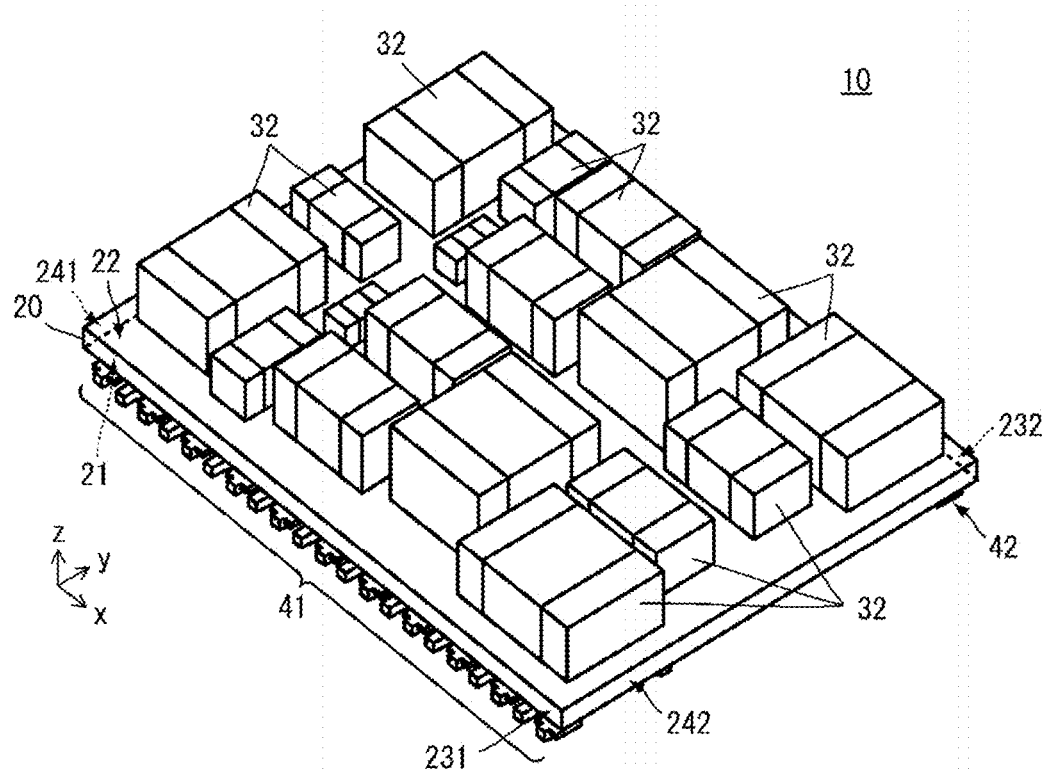
FIGS. 1A and 1B are perspective views of a circuit module according to a First Preferred Embodiment of the present invention with an insulating sealing member omitted.
Figure 1B:
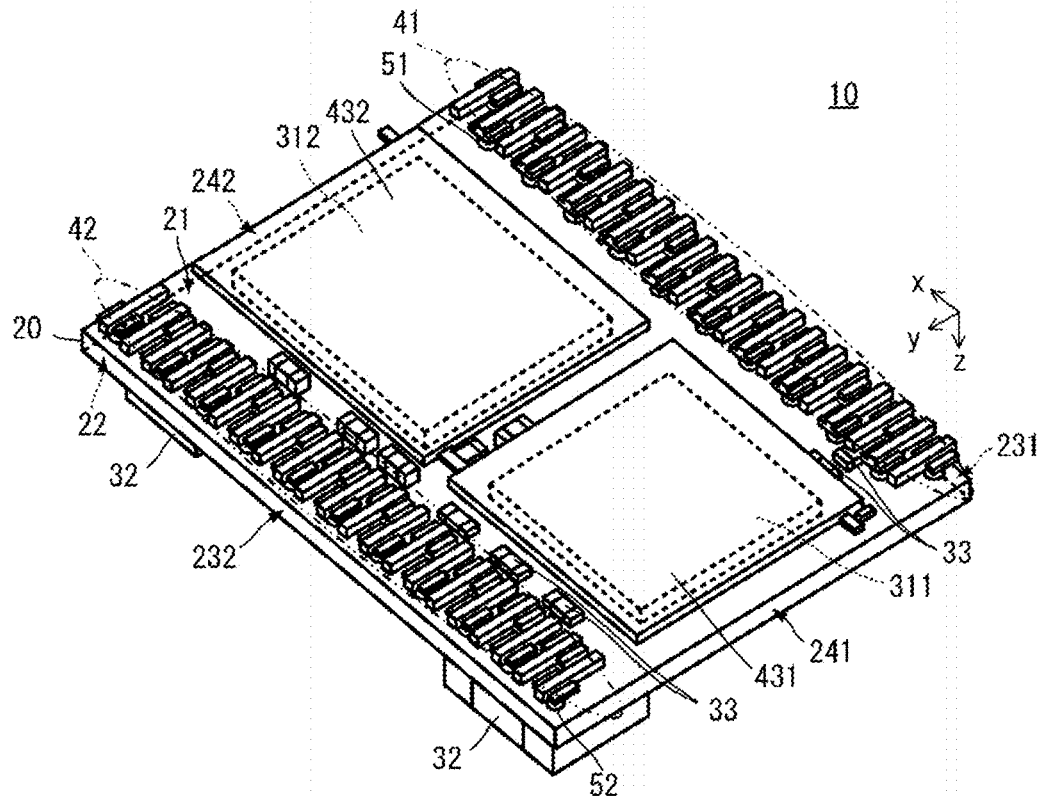
Figure 2A:
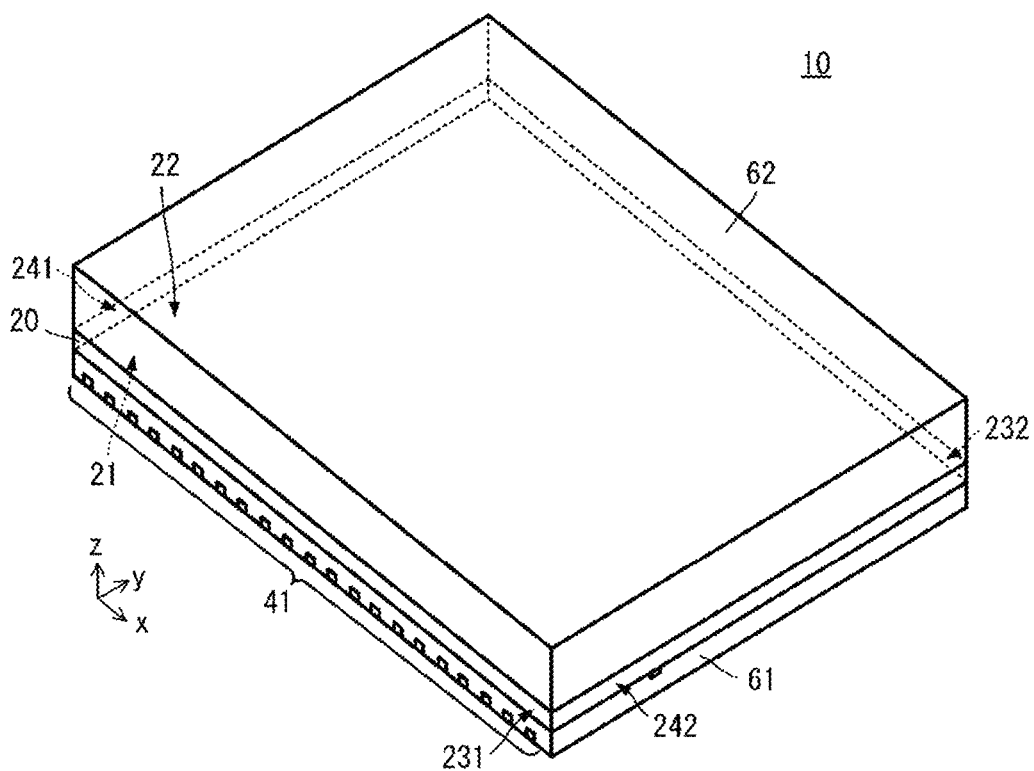
FIGS. 2A and 2B are external perspective views of the circuit module according to the First Preferred Embodiment of the present invention.
Figure 2B:
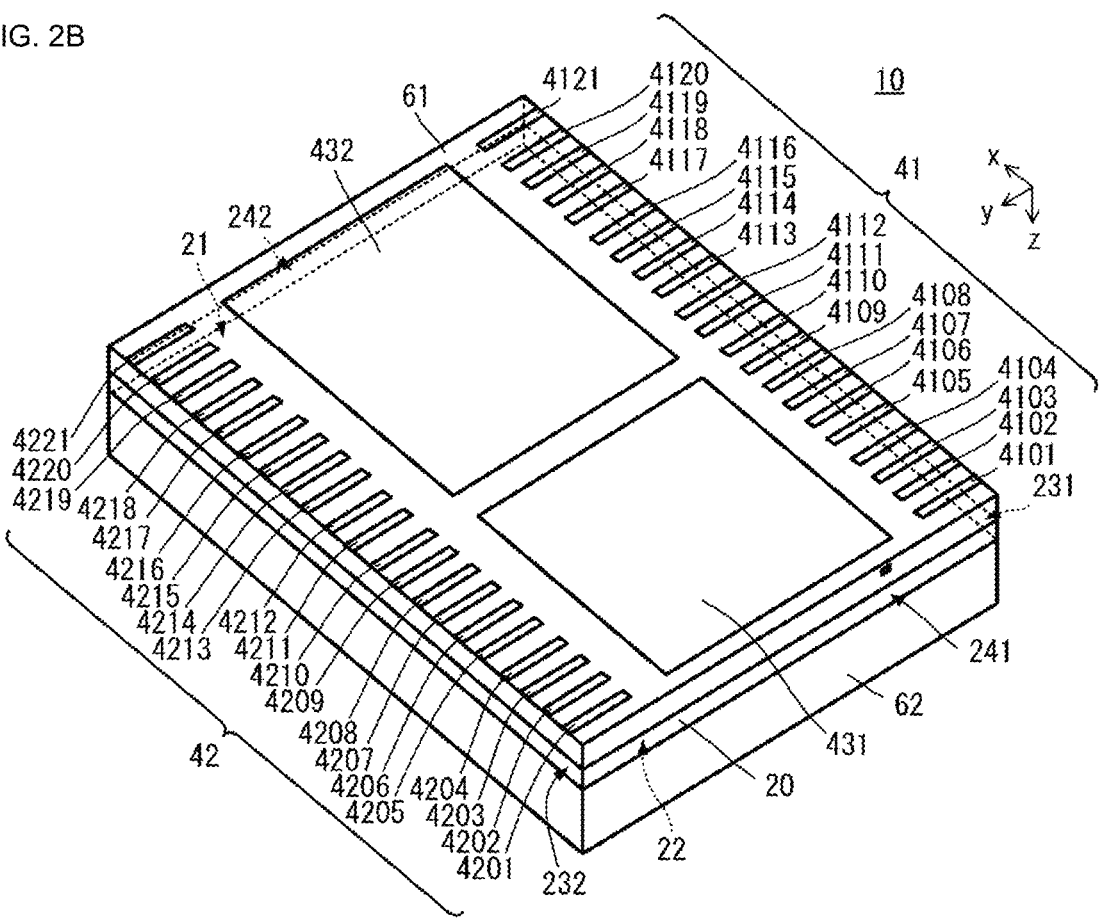

FIGS. 1A and 1B are perspective views of a circuit module according to the First Preferred Embodiment with an insulating sealing member omitted. FIG. 1B is a view from the side where a plurality of lead frames are provided (side where mounting surface for mounting on external circuit substrate is located) and FIG. 1A is a view from the opposite side from that illustrated in FIG. 1B. FIGS. 2A and 2B are external perspective views of the circuit module according to the First Preferred Embodiment. FIG. 2B is a view from the side where a plurality of lead frames are provided (side where mounting surface for mounting on external circuit substrate is located) and FIG. 2A is a view from the opposite side from that illustrated in FIG. 2B.

Figure 3:
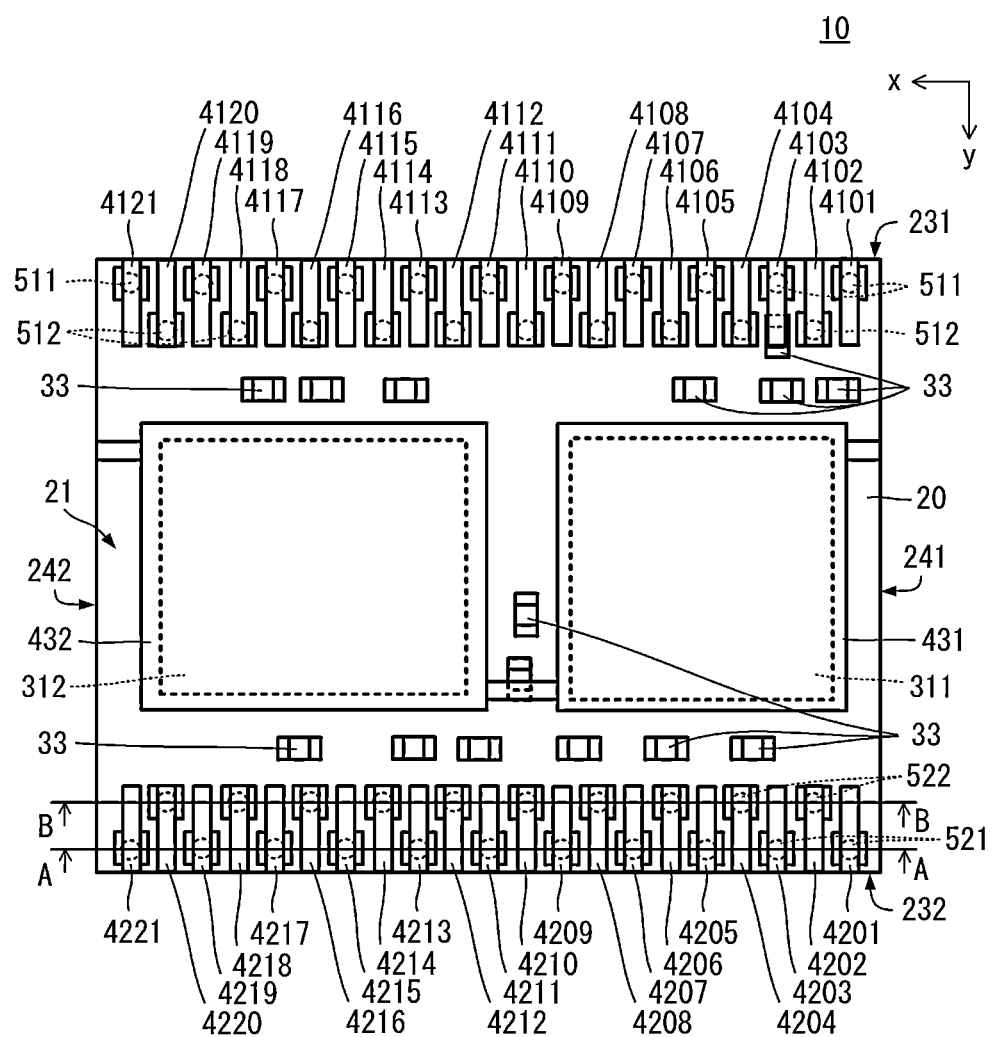
FIG. 3 is a plan view of the circuit module according to the First Preferred Embodiment of the present invention with the insulating sealing member omitted.
Figure 4:
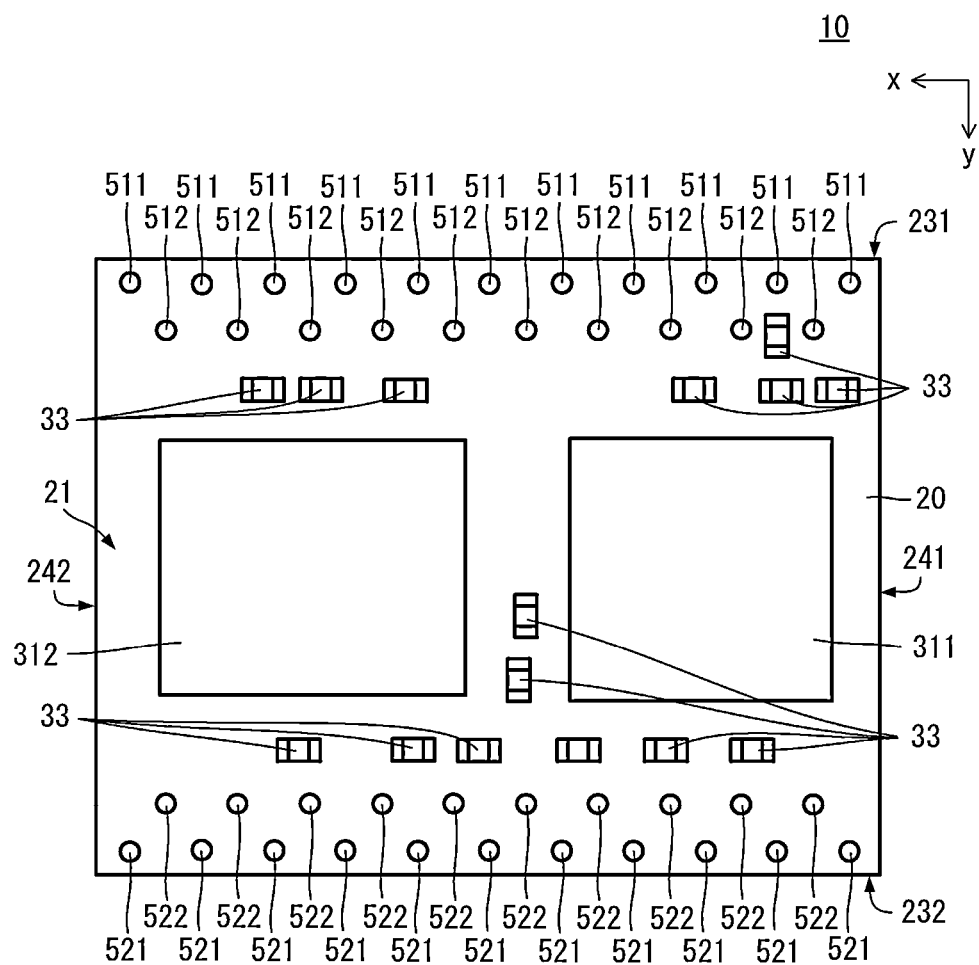
FIG. 4 illustrates a view from a side where a plurality of lead frames are provided.

FIG. 3 is a plan view of the circuit module according to the First Preferred Embodiment with the insulating sealing member omitted. FIG. 3 is a view from the side where the plurality of lead frames are provided. FIG. 4 is a plan view of the circuit module according to the First Preferred Embodiment with the insulating sealing member and lead frames omitted. FIG. 4 illustrates the view from the side where a plurality of lead frames are provided.

As illustrated in FIGS. 1A, 1B, 2A, 2B, 3, and 4, a circuit module 10 includes a substrate 20, an electronic component 311, an electronic component 312, a plurality of electronic components 32, a plurality of electronic components 33, a lead frame group 41, a lead frame group 42, a heat-dissipating plate 431, a heat-dissipating plate 432, a metal post group 51, a metal post group 52, an insulating sealing member 61, and an insulating sealing member 62.

The substrate 20 includes a main surface 21, a main surface 22, a side surface 231, a side surface 232, a side surface 241, and a side surface 242. The main surface 21 and the main surface 22 face each other. The side surface 231, the side surface 232, the side surface 241, and the side surface 242 are perpendicular to the main surface 21 and the main surface 22. The side surface 231, the side surface 232, the side surface 241, and the side surface 242 are located along the outer edges of the main surface 21 and the main surface 22, are located between the main surface 21 and the main surface 22, and are connected to the main surface 21 and the main surface 22. The side surface 231 and the side surface 232 face each other and the side surface 241 and the side surface 242 face each other. A direction parallel to the side surface 231 and the side surface 232 (x direction in the drawings) is a first direction of the circuit module 10 and a direction parallel to the side surface 241 and the side surface 242 (y direction in the drawings) is a second direction of the circuit module 10.

The substrate 20 includes an insulating base member and conductor patterns on or in the insulating base member. The conductor patterns are not illustrated, but are shaped so as to define the circuit patterns of the circuit module 10.

The electronic component 311 and the electronic component 312 are, for example, control ICs. The electronic component 311 and the electronic component 312 are, for example, semiconductor components including semiconductor material, have low-profile shapes, and are shaped such that a plurality of mounting terminals including solder bumps or the like are located on one surface thereof. In addition, the electronic component 311 and the electronic component 312 are electronic components that generate large amounts of heat.

Regulator ICs may be used as ICs. In addition, although solder bumps are used as the mounting terminals, the mounting terminals do not have to be solder bumps, and lead frame terminals or copper posts may instead be used.

The electronic component 311 and the electronic component 312 are mounted on the main surface 21 of the substrate 20. More specifically, the electronic component 311 and the electronic component 312 are mounted in a central region of the main surface 21 of the substrate 20 in the second direction. The electronic component 311 and the electronic component 312 are mounted next to each other in the first direction.

The plurality of electronic components 32 are, for example, capacitors, inductors, or the like. The plurality of electronic components 32 are chip electronic components and have terminal conductors at both ends of their casings. The plurality of electronic components 32 include electronic components with relatively large outer shapes with height dimensions greater than or equal to those of metal posts 511, 512, 521, and 522, which are described later. The plurality of electronic components 32 are mounted on the main surface 22 of the substrate 20.

The plurality of electronic components 33 are, for example, resistors, capacitors, or the like. The plurality of electronic components 33 are chip electronic components and include terminal conductors at both ends of their casings or near both ends of one surface of their casings. The plurality of electronic components 32 are components with relatively low profile shapes with height dimensions smaller than those of the metal posts 511, 512, 521, and 522 described later.

The plurality of electronic components 33 are mounted in regions of the main surface 21 of the substrate 20 other than the positions where the electronic component 311 and the electronic component 312 are mounted. For example, as illustrated in FIGS. 1B, 3, and 4, the plurality of electronic components 33 are mounted between the region in which the electronic component 311 and the electronic component 312 are mounted and the side surface 231 or the side surface 232 and between the electronic component 311 and the electronic component 312.

The lead frame group 41 includes a plurality of lead frames 4101 to 4121. The plurality of lead frames 4101 to 4121 include a metal with excellent thermal conductivity, electrical conductivity, and processability.

The plurality of lead frames 4101 to 4121 extend in the second direction. The direction in which the plurality of lead frames 4101 to 4121 extend does not have to be perfectly parallel to the second direction and, for example, may be at a certain angle to the second direction due to manufacturing errors or the like. The plurality of lead frames 4101 to 4121 are located in a region near the side surface 231 above the main surface 21. The plurality of lead frames 4101 to 4121 are separated from the main surface 21. The plurality of lead frames 4101 to 4121 are positioned at substantially regular intervals along the side surface 231, i.e., along the first direction.

The lead frame group 42 includes a plurality of lead frames 4201 to 4221. The plurality of lead frames 4201 to 4221 include a metal with excellent thermal conductivity, electrical conductivity, and processability.

The plurality of lead frames 4201 to 4221 extend in the second direction. The direction in which the plurality of lead frames 4201 to 4221 extend does not have to be perfectly parallel to the second direction and, for example, may be at a certain angle to the second direction due to manufacturing errors or the like. The plurality of lead frames 4201 to 4221 are located in a region near the side surface 232 above the main surface 21. The plurality of lead frames 4201 to 4221 are separated from the main surface 21. The plurality of lead frames 4201 to 4221 are positioned at substantially regular intervals along the side surface 232, i.e., along the first direction.

The specific shapes and arrangements of the plurality of lead frames 4101 to 4121 and the plurality of lead frames 4201 to 4221 will be described later.

The metal post group 51 includes a plurality of metal posts 511 and a plurality of metal posts 512. The plurality of metal posts 511 and 512 include a material with excellent thermal conductivity and electrical conductivity.

The plurality of metal posts 511 and the plurality of metal posts 512 are located in a region of the main surface 21 near the side surface 231. The plurality of metal posts 511 and the plurality of metal posts 512 are arranged in a prescribed pattern, which is described later, along the side surface 231, i.e., along the first direction.

The plurality of metal posts 511 and the plurality of metal posts 512 are between the plurality of lead frames 4101 to 4121 and the main surface 21 and connect the plurality of lead frames 4101 to 4121 to a plurality of conductor pads (not illustrated) on the main surface 21 corresponding to the plurality of lead frames 4101 to 4121.

The metal post group 52 includes a plurality of metal posts 521 and a plurality of metal posts 522. The plurality of metal posts 521 and 522 include a material with excellent thermal conductivity and electrical conductivity, for example, copper.

The plurality of metal posts 521 and the plurality of metal posts 522 are located in a region of the main surface 21 near the side surface 232. The plurality of metal posts 521 and the plurality of metal posts 522 are arranged in a prescribed pattern, which is described later, along the side surface 232, i.e., along the first direction.

The plurality of metal posts 521 and the plurality of metal posts 522 are located between the plurality of lead frames 4201 to 4221 and the main surface 21 and connect the plurality of lead frames 4201 to 4221 to a plurality of conductor pads (not illustrated) on the main surface 21 corresponding to the plurality of lead frames 4201 to 4221.

The insulating sealing member 61 and the insulating sealing member 62 include an insulating resin, for example.

The insulating sealing member 61 covers the main surface 21 side of the substrate 20. More specifically, as illustrated in FIG. 2B, the insulating sealing member 61 covers the electronic component 311, the electronic component 312, the plurality of electronic components 33, the plurality of metal posts 511, the plurality of metal posts 512, the plurality of metal posts 521, and the plurality of metal posts 522 on the main surface 21 of the substrate 20. Furthermore, the insulating sealing member 61 covers the plurality of lead frames 4101 to 4121 and the plurality of lead frames 4201 to 4221 except for the bottom surfaces of the plurality of lead frames 4101 to 4121 and the plurality of lead frames 4201 to 4221 (refer to bottom surfaces BB1 and BB2 in FIGS. 7A to 7E and 8A and 8B). In other words, the insulating sealing member 61 covers the plurality of lead frames 4101 to 4121 and the plurality of lead frames 4201 to 4221 so that only the bottom surfaces of the plurality of lead frames 4101 to 4121 and the plurality of lead frames 4201 to 4221 are exposed to the outside.

The insulating sealing member 62 covers the main surface 22 side of the substrate 20. More specifically, as illustrated in FIG. 2A, the insulating sealing member 62 covers the plurality of electronic components 32 on the main surface 22 of the substrate 20.

Specific Configurations of Lead Frames and Metal Posts Shape and Arrangement of Metal Posts The plurality of metal posts 511, the plurality of metal posts 512, the plurality of metal posts 521, and the plurality of metal posts 522 preferably have cylindrical or substantially cylindrical shapes, for example. The plurality of metal posts 511, the plurality of metal posts 512, the plurality of metal posts 521, and the plurality of metal posts 522 preferably have the same shape. The term "same shape" used here encompasses a range of variations taking into account manufacturing errors.

The plurality of metal posts 511, the plurality of metal posts 512, the plurality of metal posts 521, and the plurality of metal posts 522 are connected to a plurality of conductor pads on the main surface 21 of the substrate 20 at first ends thereof in the extension direction of their cylindrical shapes.

The plurality of metal posts 511, the plurality of metal posts 512, the plurality of metal posts 521, and the plurality of metal posts 522 are connected to the plurality of lead frames 4101 to 4121 and the plurality of lead frames 4201 to 4221 at the other ends thereof in the extension direction of their cylindrical shapes.

As illustrated in FIG. 4, the plurality of metal posts 511 and the plurality of metal posts 512 are located in a region nearer the side surface 231 in the second direction (y direction) than the electronic component 311 and the electronic component 312 are.

The plurality of metal posts 511 are arranged at prescribed intervals along the side surface 231 (along the first direction) in the vicinity of the side surface 231.

The plurality of metal posts 512 are positioned at prescribed intervals along the side surface 231 (along the first direction) in the vicinity of the region in which the plurality of metal posts 511 are located. Here, the plurality of metal posts 512 are located at positions that are farther from the side surface 231 in the second direction than the plurality of metal posts 511 are.

The positions at which the plurality of metal posts 511 are located in the first direction and the positions at which the plurality of metal posts 512 are located in the first direction are different from each other. More specifically, the plurality of metal posts 511 and the plurality of metal posts 512 are located in an alternating manner (in a staggered arrangement) in the first direction.

As illustrated in FIG. 4, the plurality of metal posts 521 and the plurality of metal posts 522 are located in a region nearer the side surface 232 in the second direction (y direction) than the electronic component 311 and the electronic component 312 are.

The plurality of metal posts 521 are positioned at prescribed intervals along the side surface 232 (along the first direction) in the vicinity of the side surface 232.

The plurality of metal posts 522 are positioned at prescribed intervals along the side surface 232 (along the first direction) in the vicinity of the region in which the plurality of metal posts 521 are located. Here, the plurality of metal posts 522 are located at positions that are farther from the side surface 232 in the second direction than the plurality of metal posts 521 are.

The positions at which the plurality of metal posts 521 are located in the first direction and the positions at which the plurality of metal posts 522 are located in the first direction are different from each other. More specifically, the plurality of metal posts 521 and the plurality of metal posts 522 are arranged in an alternating manner (in a staggered arrangement) in the first direction.

Shape and Arrangement of Lead Frames

Figure 5A:
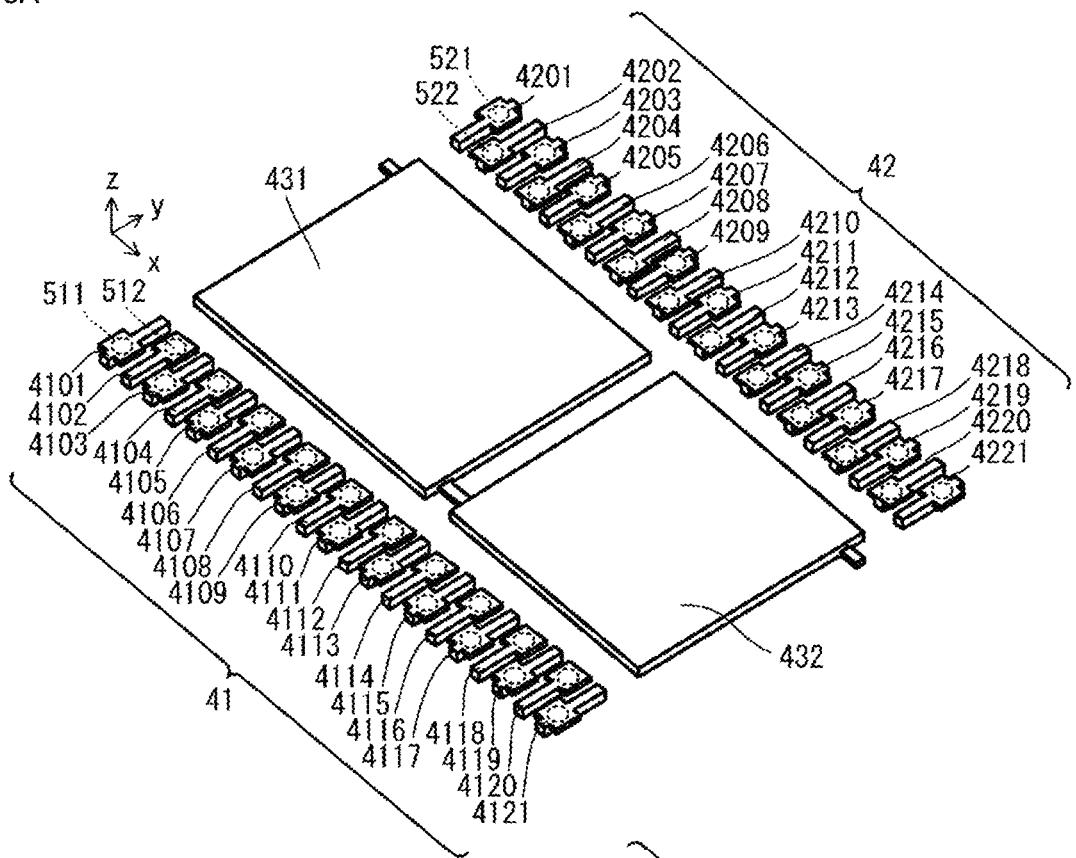
FIGS. 5A and 5B are perspective views illustrating the shapes of the plurality of lead frames and heat-dissipating plates.
Figure 5B:
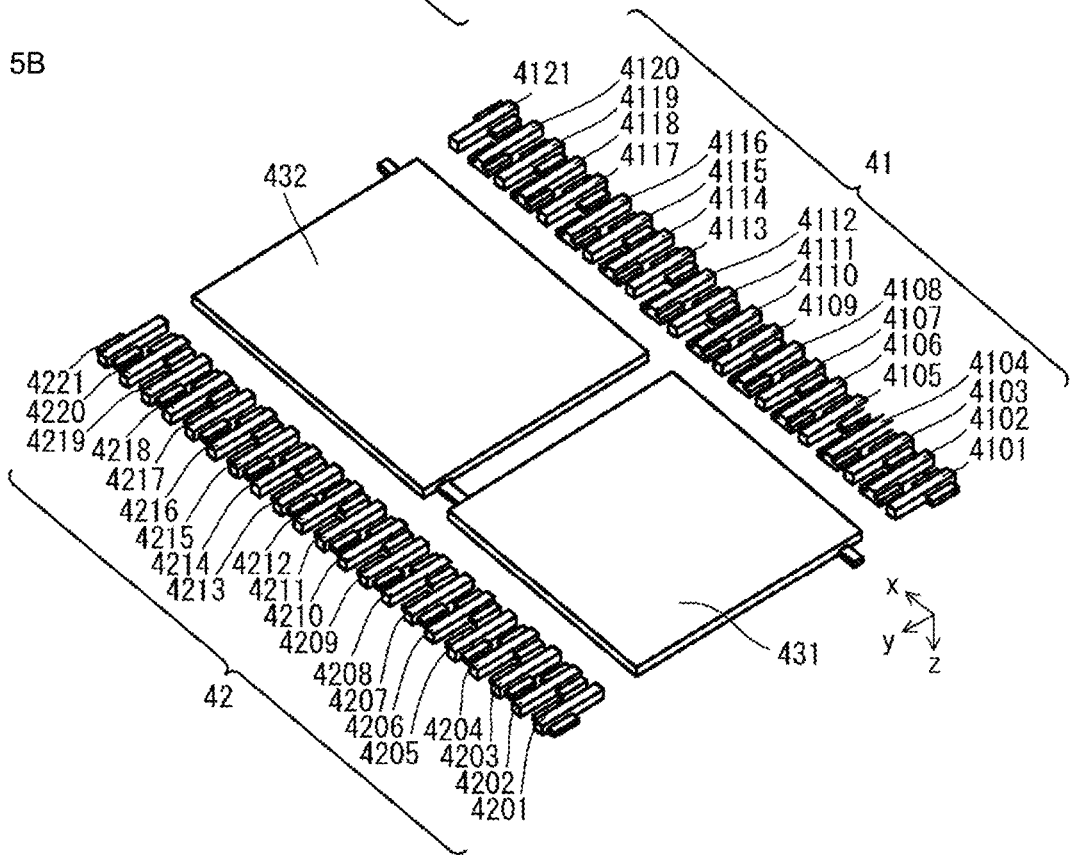
Figure 6A:
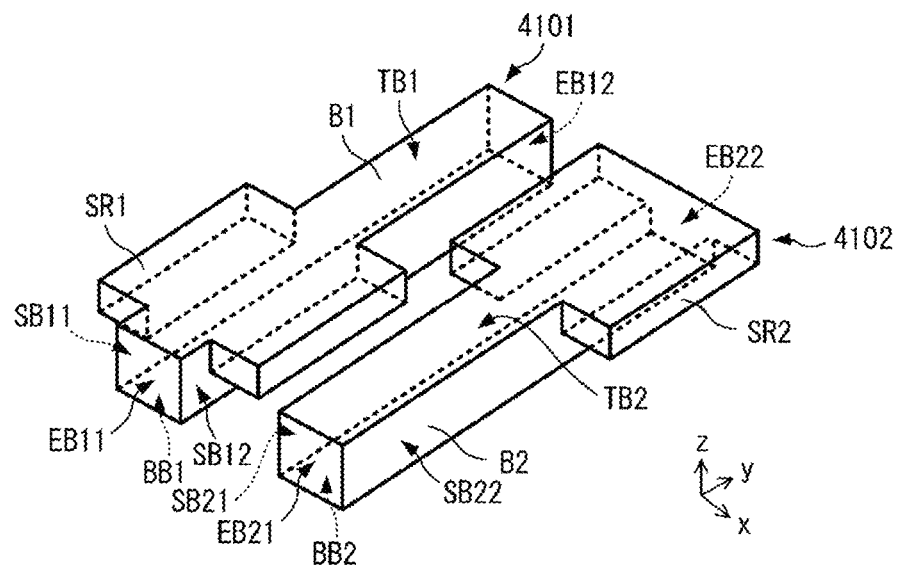
FIGS. 6A and 6B are enlarged perspective views of two adjacent lead frames.
Figure 6B:
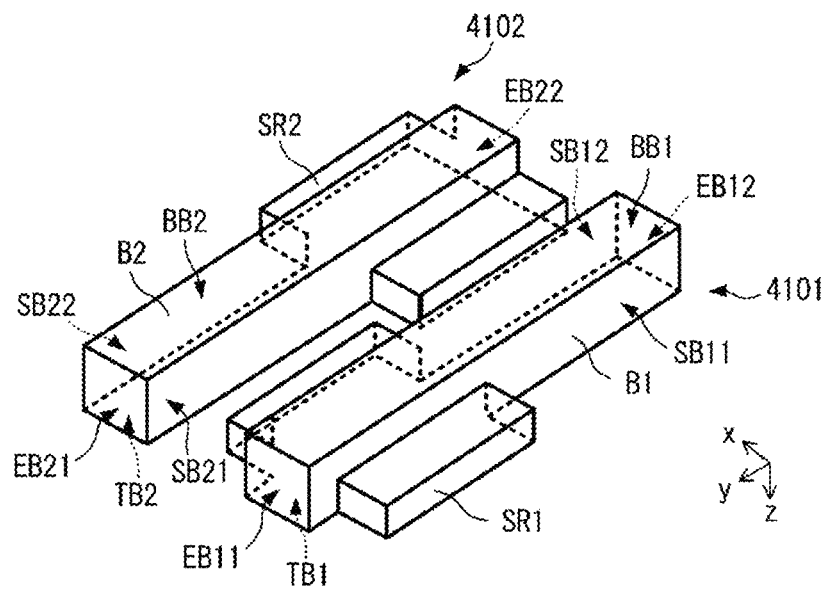
Figure 7C:
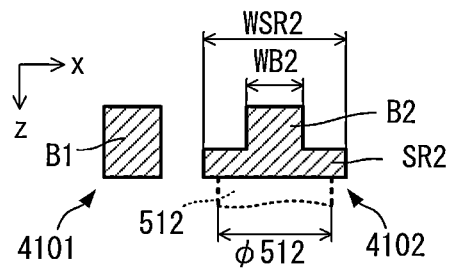
FIGS. 7A to 7E illustrate various views of two adjacent lead frames.
Figure 7D:
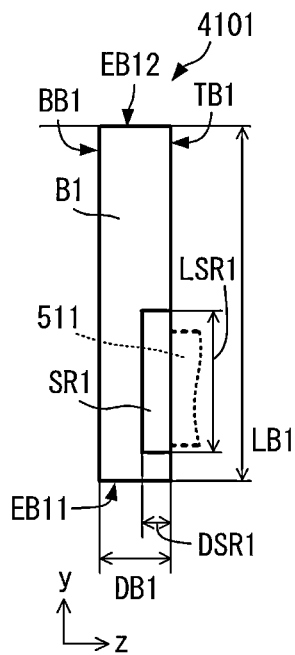
Figure 7A:
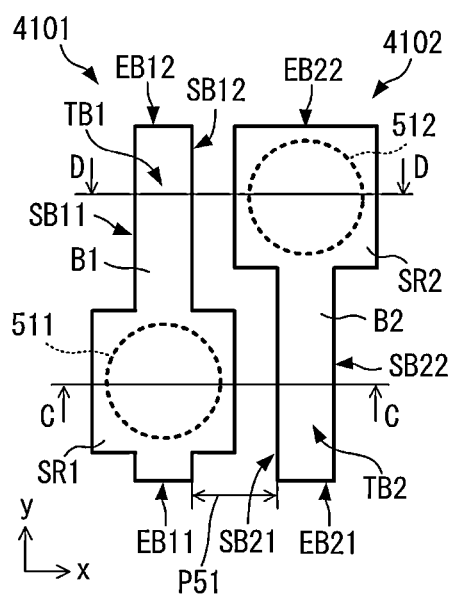
Figure 7E:
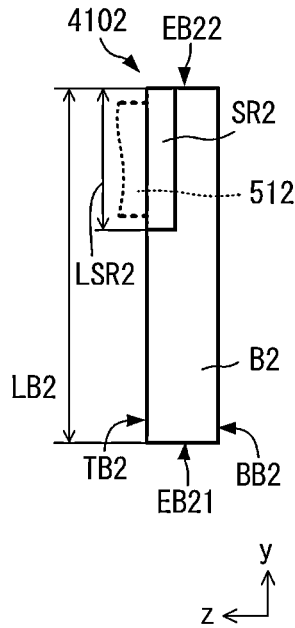
Figure 7B:
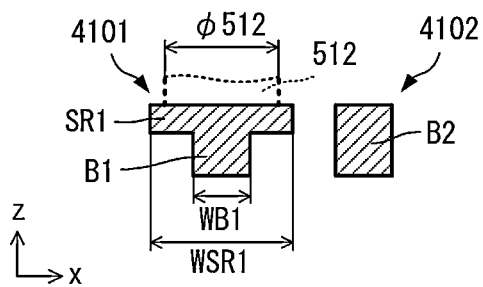

FIGS. 5A and 5B are perspective views illustrating the shapes of a plurality of lead frames and heat-dissipating plates. FIG. 5A is a view from the side where the substrate is located and FIG. 5B is a view from a side where a mounting surface of the circuit module for external mounting is located. FIGS. 6A and 6B are enlarged perspective views of two adjacent lead frames. FIG. 6A is a view from the side where the substrate is located and FIG. 6B is a view from a side where a mounting surface of the circuit module for external mounting is located. FIGS. 7A to 7E illustrate various views of two adjacent lead frames. FIG. 7A is a plan view, FIG. 7B is a C-C sectional view, FIG. 7C is a D-D sectional view, and FIGS. 7D and 7E are side views.

As illustrated in the figures, the plurality of lead frames 4101 to 4121 and the plurality of lead frames 4201 to 4221 can be roughly classified as with two different shapes. A first shape is used for the lead frames 4101, 4103, 4105, 4107, 4109, 4111, 4113, 4115, 4117, 4119, and 4121 out of the plurality of lead frames 4101 to 4121 and for the lead frames 4201, 4203, 4205, 4207, 4209, 4211, 4213, 4215, 4217, 4219, and 4221 out of the lead frames 4201 to 4221. A second shape is used for lead frames 4102, 4104, 4106, 4108, 4110, 4112, 4114, 4116, 4118, and 4120 out of the plurality of lead frames 4101 to 4121 and for the lead frames 4202, 4204, 4206, 4208, 4210, 4212, 4214, 4216, 4218, and 4220 out of the lead frames 4201 to 4221.

The first shape will be described using the lead frame 4101 as an example and the second shape will be using the lead frame 4102 as an example while referring to FIGS. 6A and 6B and FIGS. 7A to 7E.

The lead frame 4101 includes a lead portion B1 and a pad portion SR1. The lead portion B1 and the pad portion SR1 are integrated with each other.

The lead portion B1 has a rectangular or substantially rectangular parallelepiped shape and includes a top surface TB1, a bottom surface BB1, an end surface EB11, an end surface EB12, a side surface SB11, and a side surface SB12. The end surface EB11 and the end surface EB12 are end surfaces in the long side direction of the rectangular or substantially rectangular parallelepiped shape. The side surface SB11 and the side surface SB12 are end surfaces in the short side direction of the rectangular or substantially rectangular parallelepiped shape. The top surface TB1 corresponds to a "first LF surface" and the bottom surface BB1 corresponds to a "second LF surface".

The pad portion SR1 has a flat plate shape. The planar shape of the pad portion SR1 is square or substantially square. A length WSR1 of each side of the pad portion SR1 is larger than a diameter φ511 of the metal post 511 connected to the pad portion SR1. In addition, the length WSR1 of each side of the pad portion SR1 is smaller than a length LB1 of the lead portion B1 (distance between end surface EB11 and end surface EB12).

A thickness DSR1 of the pad portion SR1 is smaller than a thickness DB1 of the lead portion B1 (distance between top surface TB1 and bottom surface BB1).

The pad portion SR1 is provided at the top surface TB1 of the lead portion B1. More specifically, the pad portion SR1 is provided in the lead portion B1 so that the top surface of the pad portion SR1 is flush with the top surface TB1 of the lead portion B1. In addition, the pad portion SR1 is provided in the lead portion B1 so that the center of the pad portion SR1 in plan view is aligned with the center of the lead portion B1 in the short side direction thereof. As a result, spaces are provided at the bottom surface side of the pad portion SR1 where the lead portion B1 is not present.

In other words, the lead portion B1 has a rectangular or substantially rectangular parallelepiped shape with a recess in a portion where the lead portion B1 is to be connected to the flat-plate-shaped pad portion SR1. The lead frame 4101 is formed by fitting the pad portion SR1 into this recess in the lead portion B1.

The pad portion SR1 is provided in the vicinity of the end surface EB11 in the long side direction of the lead portion B1. In other words, the pad portion SR1 is provided at a position that is nearer to the end surface EB11 than to the end surface EB12 in the long side direction of the lead portion B1.

The lead frame 4102 includes a lead portion B2 and a pad portion SR2. The lead portion B2 and the pad portion SR2 are integrated with each other.

The lead portion B2 has a rectangular or substantially rectangular parallelepiped shape and has a top surface TB2, a bottom surface BB2, an end surface EB21, an end surface EB22, a side surface SB21, and a side surface SB22. The end surface EB21 and the end surface EB22 are end surfaces in the long side direction of the rectangular or substantially rectangular parallelepiped shape. The side surface SB21 and the side surface SB22 are end surfaces in the short side direction of the rectangular or substantially rectangular parallelepiped shape. The top surface TB2 corresponds to a "first LF surface" and the bottom surface BB2 corresponds to a "second LF surface".

The pad portion SR2 has a flat plate shape. The planar shape of the pad portion SR2 is a square or substantially square shape. A length WSR2 of each side of the pad portion SR2 is larger than a diameter φ512 of the metal post 512 connected to the pad portion SR2. In addition, the length WSR2 of each side of the pad portion SR2 is smaller than a length LB2 of the lead portion B2 (distance between end surface EB21 and end surface EB22).

A thickness DSR2 of the pad portion SR2 is smaller than a thickness DB2 of the lead portion B2 (distance between top surface TB2 and bottom surface BB2).

The pad portion SR2 is provided at the top surface TB2 of the lead portion B2. More specifically, the pad portion SR2 is provided in the lead portion B2 so that the top surface of the pad portion SR2 is flush with the top surface TB2 of the lead portion B2. In addition, the pad portion SR2 is provided in the lead portion B2 so that the center of the pad portion SR2 in plan view is aligned with the center of the lead portion B2 in the short side direction thereof. As a result, spaces are provided at the bottom surface side of the pad portion SR2 where the lead portion B2 is not present.

In other words, the lead portion B2 has a rectangular or substantially rectangular parallelepiped shape with a recess in a portion where the lead portion B2 is to be connected to the flat plate-shaped pad portion SR2. The lead frame 4102 is formed by fitting the pad portion SR2 into this recess in the lead portion B2.

The pad portion SR2 is provided in the vicinity of the end surface EB22 in the long side direction of the lead portion B2. In other words, the pad portion SR2 is provided at a position that is nearer to the end surface EB22 than to the end surface EB11 in the long side direction of the lead portion B2.

The lead frame 4101 and the lead frame 4102 are positioned with an interval P51 therebetween so that the long side directions thereof are parallel or substantially parallel to each other. The lead frame 4101 and the lead frame 4102 are positioned so that the end surface EB11 of the lead portion B1 and the end surface EB21 of the lead portion B2 are on the same side with respect to the lead portions B1 and B2. In other words, the pad portion SR1 of the lead frame 4101 and the pad portion SR2 of the lead frame 4102 are located at different positions in the direction in which the lead portions B1 and B2 extend (second direction of circuit module 10), more preferably so as to be at positions that do not overlap in the direction in which the lead portions B1 and B2 extend (second direction of circuit module 10).

The interval P51 is set on the basis of the length by which the pad portion SR1 projects from the lead portion B1, the length by which the pad portion SR2 projects from the lead portion B2, the electrical insulation between the pad portion SR1 and the pad portion SR2, and the electrical insulation between the lead portion B1 and the lead portion B2.

With this configuration, the pad portion SR1 of the lead frame 4101 is not adjacent to the pad portion SR2 of the lead frame 4102 but is adjacent to the lead portion B2 in the direction in which the lead frame 4101 and the lead frame 4102 are arrayed (first direction of circuit module 10). Similarly, the pad portion SR2 of the lead frame 4102 is not adjacent to the pad portion SR1 of the lead frame 4101 but is adjacent to the lead portion B1.

This enables the interval between the lead frame 4101 and the lead frame 4102 to be reduced compared with the case where the entire lead portions B1 and B2 of the lead frames 4101 and 4102 have the same width as the pad portions SR1 and SR2, i.e., have rectangular or substantially rectangular parallelepiped shapes with the same width as the pad portions SR1 and SR2.

Furthermore, in plan view (viewed in the thickness direction of the circuit module 10), the pad portions SR1 and SR2 completely overlap the metal posts 511 and 512. Thus, heat is effectively conducted through the metal posts 511 and 512 to the pad portions SR1 and SR2. The lead portions B1 and B2 of the lead frames 4101 and 4102 are longer in the second direction than the pad portions SR1 and SR2. Therefore, heat diffuses in the long side direction of the lead portions B1 and B2 and is effectively conducted even though the lead portions B1 and B2 are shorter than the pad portions SR1 and SR2 in the first direction. This allows the lead frames 4101 and 4102 to effectively dissipate heat from the metal posts 511 and 512 to the outside.

The thus-configured lead frames with the first shape and lead frames with the second shape are positioned in an alternating manner in the first direction (x direction) of the circuit module 10 as illustrated in FIGS. 5A and 5B. In the lead frame group 41, the lead frame 4101 with the first shape, the lead frame 4102 with the second shape, the lead frame 4103 with the first shape, the lead frame 4104 with the second shape, . . . , and the lead frame 4121 with the first shape are arranged in this order. In the lead frame group 42, the lead frame 4201 with the first shape, the lead frame 4202 with the second shape, the lead frame 4203 with the first shape, the lead frame 4204 with the second shape, . . . , and the lead frame 4221 with the first shape are positioned in this order.

Figure 8A:
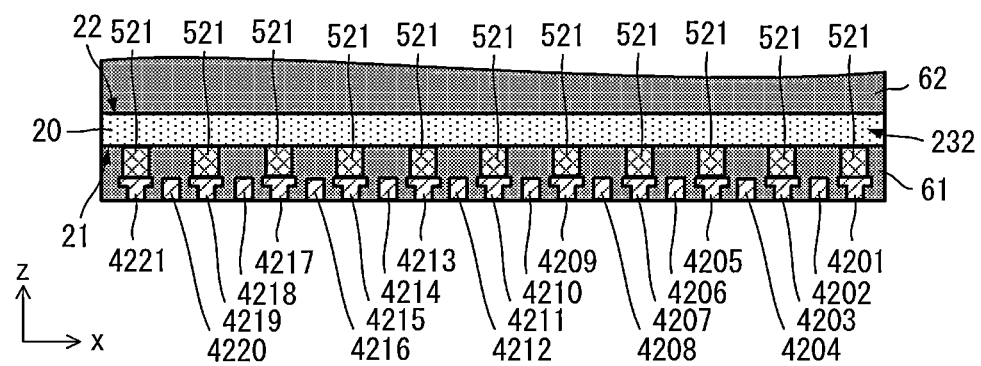
FIGS. 8A and 8B are sectional views illustrating the arrangements and shapes of lead frames and metal posts.
Figure 8B:
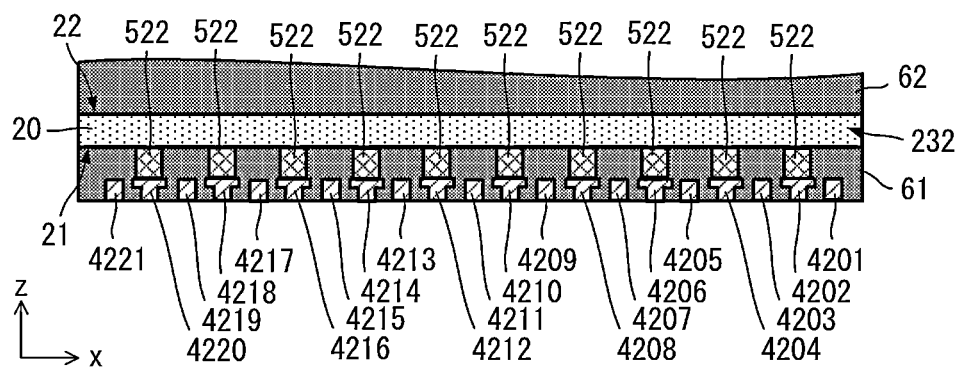

FIGS. 8A and 8B are sectional views illustrating the arrangements and shapes of lead frames and metal posts. FIG. 8A illustrates a cross section taken along A-A in FIG. 3 and FIG. 8B illustrates a cross section taken along B-B in FIG. 3.

As a result of the circuit module 10 with the above-described configuration, as illustrated in FIGS. 8A and 8B, the interval between the lead portions of the plurality of lead frames 4201 to 4221 can be made larger than the interval between the plurality of metal posts 521 and 522 despite the interval at which the plurality of metal posts 521 and 522 are positioned in the first direction with been made smaller while forming the plurality of metal posts 521 and 522 with a desired diameter. Furthermore, a reduction in the areas of connections between the metal posts 521 and 522 and the lead frames 4201 to 4221 can be suppressed and the circuit module 10 can effectively achieve conduction of heat from the metal posts 521 and 522 to the lead frames 4201 to 4221.

Thus, the circuit module 10 can reduce or prevent a decrease in heat dissipation performance realized by the plurality of metal posts and the plurality of lead frames while securing insulation between the plurality of metal posts and between the plurality of lead frames. In other words, the circuit module 10 can achieve heat dissipation performance, secure spaces between the metal posts, and secure spaces between the lead frames. As a result, for example, the circuit module 10 can realize both heat dissipation performance and a reduction in size. For example, a small-sized power supply circuit module with excellent heat dissipation performance can be realized by the circuit module 10.

Furthermore, in the circuit module 10, the plurality of lead frames 4101 to 4121 and 4201 to 4221 are separated from the main surface 21 of the substrate 20. The plurality of lead frames 4101 to 4121 and 4201 to 4221 are connected to the main surface 21 of the substrate 20 by the plurality of cylindrical metal posts 511, 512, 521, and 522. As a result, spaces are provided between the plurality of lead frames 4101 to 4121 and 4201 to 4221 and the main surface 21 of the substrate 20. Utilizing these spaces, for example, as illustrated in FIGS. 1B and 3, low-profile electronic components 33, more specifically, electronic components with a lower profile than the metal posts and with a width smaller than the distance between adjacent metal posts can be located between the lead frames and the substrate 20. Therefore, in the circuit module 10, the regions in which the electronic components 33 are located can be widened to include regions overlapping the plurality of lead frames, thus saving space.

Furthermore, as described above, in the circuit module 10, spaces are provided below the pad portions of the plurality of lead frames. In other words, in the circuit module 10, the lead portions can be separated from each other by a prescribed distance regardless of the shape of the pad portions.

This allows conductor patterns and so forth to be provided in these portions. Specifically, for example, conductor patterns can be located at positions overlapping the spaces between the lead portions of the plurality of lead frames of the circuit module 10 in or on an external circuit substrate on which the circuit module 10 is mounted. Therefore, the degree of freedom when designing the wiring of the external circuit substrate is improved and the degree of freedom when disposing the circuit module 10 relative to the external circuit substrate is improved.

Furthermore, in the above-described configuration, the electronic components 311 and 312, which generate large amounts of heat, are mounted on the main surface 21 of the substrate 20, i.e., on the main surface of the circuit module 10 that is on the mounting surface (mounting surface for mounting on an external circuit substrate) side. In addition, the heat-dissipating plates 431 and 432 overlap the electronic components 311 and 312 that generate large amounts of heat and the heat-dissipating plates 431 and 432 are exposed to the outside from the insulating sealing member 61. This allows heat from the electronic components 311 and 312, which generate large amounts of heat, to be effectively dissipated to the outside. In addition, heat from the electronic components 311 and 312 is also dissipated to the outside through the substrate 20 and through the plurality of metal posts and the plurality of lead frames, which have excellent heat dissipation performance as described above.

Therefore, the circuit module 10 is able to more effectively dissipate heat from the electronic components 311 and 312. For example, when the circuit module 10 is a power supply circuit module, heat from the electronic components 311 and 312, which are switching ICs, can be effectively dissipated and adverse effects on the power supply circuit module caused by heat (reduced reliability or degraded characteristics) can be effectively reduced or prevented.

In the above description, a case in which the pad portions have a shape that does not extend to the bottom surfaces of the lead portions has been described, but a shape may be adopted in which the pad portions do extend to the bottom surfaces of the lead portions.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A circuit module comprising:
   a substrate on which a plurality of electronic components defining an electronic circuit are mounted and including a first main surface;
   a plurality of lead frames separated from the substrate at a side where the first main surface of the substrate is located;
   a plurality of columnar metal posts between the plurality of lead frames and the first main surface and connecting the plurality of lead frames and electrodes on the first main surface to each other; and
   an insulating seal to seal the plurality of metal posts, the first main surface, and portions of the plurality of lead frames; wherein
   the plurality of lead frames include:
      first LF surfaces facing the first main surface and second LF surfaces that are on an opposite side from the first LF surfaces and are exposed from the insulating seal; and
      pad portions that include portions of the first LF surfaces and are connected to the metal posts; wherein
      the pad portions overlap the metal posts when viewed through the insulating seal in a direction perpendicular to the first main surface.

2. The circuit module according to claim 1, wherein
   the plurality of lead frames are arrayed at a certain distance from each other along a first direction parallel to the first main surface; and
   a dimension of the second LF surfaces in the first direction is smaller than a dimension of the pad portions of the first LF surfaces in the first direction.

3. The circuit module according to claim 2, wherein
   a second direction is a direction parallel to the first main surface and perpendicular to the first direction; and
   a dimension of the lead frames in the second direction is larger than a dimension of the pad portions in the second direction.

4. The circuit module according to claim 3, wherein
   the lead frames each include a lead portion longer in the second direction than the pad portion; and
   the pad portion projects from both sides of the lead frame in the first direction.

5. The circuit module according to claim 4, wherein thickness of each of the pad portions is less than a thickness of each of the lead portions.

6. The circuit module according to claim 4, wherein respective ones of the lead portions and respective ones of the pad portions are integrated with each other.

7. The circuit module according to claim 4, wherein an interval between the lead portions of the plurality of lead frames is larger than an interval between the plurality of metal posts.

8. The circuit module according to claim 3, wherein when adjacent lead frames of the plurality of lead frames are regarded as a first lead frame and a second lead frame, a position of the pad portion of the first lead frame and a position of the pad portion of the second lead frame in the second direction do not overlap.

9. The circuit module according to claim 1, further comprising:
   an electronic component mounted on the first main surface; wherein
   the metal posts have a height direction dimension that is larger than a height direction dimension of the electronic component; and
   a distance between adjacent metal posts is larger than a width of the electronic component.

10. The circuit module according to claim 1, wherein a semiconductor component is mounted on the first main surface.

11. The circuit module according to claim 10, wherein
    the semiconductor component is an integrated circuit and does not overlap the plurality of lead frames when viewed in a direction perpendicular to the first main surface;
    the circuit module further comprising:
       a heat-dissipating plate that is partially exposed from the insulating seal and overlaps an integrated circuit of the electronic component when viewed in a direction perpendicular to the first main surface.

12. The circuit module according to claim 1, wherein the substrate includes an insulating base and conductor patterns in or on the insulating base.

13. The circuit module according to claim 1, wherein the plurality of electronic components include control integrated circuits or regulator integrated circuits.

14. The circuit module according to claim 1, wherein the plurality of electronic components include capacitors, inductors, or chip electronic components including terminal conductors at ends thereof.

15. The circuit module according to claim 1, wherein the insulating seal covers the plurality of electronic components, the plurality of metal posts, and portions of the plurality of lead frames.

16. The circuit module according to claim 15, wherein bottom portions of the plurality of lead frames are exposed to outside and not covered by the insulating seal.

17. The circuit module according to claim 1, wherein the plurality of metal posts are cylindrical or substantially cylindrical and have a same shape or substantially a same shape.

18. The circuit module according to claim 1, wherein the plurality of lead frames includes a first group of lead frames with a first shape and a second group of lead frames with a second shape different from the first shape.

19. The circuit module according to claim 18, wherein the first group of lead frames are positioned alternatingly with the second group of lead frames in the first direction.

20. The circuit module according to claim 1, wherein at least one of the lead portions has a rectangular or substantially rectangular shape with a recess in a portion where the at least one of the lead portions is connectable to one of the pad portions.

\* \* \* \* \*